(12) United States Patent
Murasko et al.

(10) Patent No.: US 7,001,639 B2
(45) Date of Patent: Feb. 21, 2006

(54) ELECTROLUMINESCENT DEVICES FABRICATED WITH ENCAPSULATED LIGHT EMITTING POLYMER PARTICLES

(75) Inventors: Matthew M. Murasko, Manhattan Beach, CA (US); Patrick J. Kinlen, Fenton, MO (US); Brent St. John, St. Louis, MO (US)

(73) Assignee: Lumimove, Inc., Fenton, MO (US)

( * ) Notice: Subject to any disclaimer, the term of this patent is extended or adjusted under 35 U.S.C. 154(b) by 150 days.

(21) Appl. No.: 10/135,599

(22) Filed: Apr. 30, 2002

(65) Prior Publication Data

US 2003/0032361 A1 Feb. 13, 2003

Related U.S. Application Data

(60) Provisional application No. 60/287,612, filed on Apr. 30, 2001, provisional application No. 60/287,321, filed on Apr. 30, 2001.

(51) Int. Cl.
*B05D 5/12* (2006.01)
*B05D 5/06* (2006.01)

(52) U.S. Cl. ........................... 427/66; 427/222
(58) Field of Classification Search ................. 427/66, 427/222
See application file for complete search history.

(56) References Cited

U.S. PATENT DOCUMENTS

| | | | |
|---|---|---|---|
| 2,924,732 A | 2/1960 | Lehmann | 313/108 |
| 3,052,810 A | 9/1962 | Mash | 313/108 |
| 3,621,321 A | 11/1971 | Williams et al. | 313/108 A |
| 4,263,339 A | 4/1981 | Fischer | 427/64 |
| 4,539,507 A | 9/1985 | VanSlyke et al. | 313/504 |
| 4,672,265 A | 6/1987 | Eguchi et al. | 313/504 |
| 4,855,189 A | 8/1989 | Simopoulos et al. | 428/690 |
| 4,855,190 A | 8/1989 | Bezner | 428/690 |
| 4,857,416 A | 8/1989 | Kreiling et al. | 428/690 |
| 5,247,190 A | 9/1993 | Friend et al. | 257/40 |
| 5,309,070 A | 5/1994 | Sun et al. | 313/503 |
| 5,309,071 A | 5/1994 | Karam et al. | 313/509 |
| 5,426,792 A | 6/1995 | Murasko | 2/422 |
| 5,457,565 A * | 10/1995 | Namiki et al. | 359/273 |
| 5,543,237 A | 8/1996 | Watanabe | 428/691 |
| 5,552,679 A | 9/1996 | Murasko | 315/169.3 |
| 5,554,449 A | 9/1996 | Tonomura et al. | 428/690 |
| 5,583,394 A * | 12/1996 | Burbank et al. | 313/498 |
| 5,593,782 A | 1/1997 | Budd | 428/403 |
| 5,598,058 A | 1/1997 | LaPointe | 313/503 |
| 5,598,059 A | 1/1997 | Sun et al. | 313/509 |
| 5,602,445 A | 2/1997 | Solanki et al. | 313/503 |
| 5,612,591 A | 3/1997 | Katayama et al. | 313/503 |
| 5,635,110 A | 6/1997 | Chadha et al. | 252/301.4 R |

(Continued)

FOREIGN PATENT DOCUMENTS

EP 0294061 A1 7/1988

(Continued)

OTHER PUBLICATIONS

Article published in Bull. Korean Chem. Soc., vol. 20, No. 9, 1999 by Jeong Hee Han et al. entitled Correlation between Energy Transfer and Phase Separation in Emissive Polymer Blends.

(Continued)

*Primary Examiner*—Michael Cleveland
(74) *Attorney, Agent, or Firm*—Nelson Mullins Riley & Scarborough, LLP

(57) ABSTRACT

The present system provides electroluminescent devices including electroluminescent panels, and more specifically, electroluminescent devices fabricated from materials including light emitting polymers and particles comprising light emitting polymers that have been encapsulated with conductive polymers and/or insulative polymers.

18 Claims, 5 Drawing Sheets

U.S. PATENT DOCUMENTS

| | | | |
|---|---|---|---|
| 5,643,496 A | 7/1997 | Brese et al. | 252/301.65 |
| 5,652,067 A | 7/1997 | Ito et al. | 428/690 |
| 5,667,724 A | 9/1997 | Petersen | 252/301.6 |
| 5,675,217 A | 10/1997 | Kang | 313/509 |
| 5,677,594 A | 10/1997 | Sun et al. | 313/503 |
| 5,682,043 A | 10/1997 | Pei et al. | 257/40 |
| 5,700,591 A | 12/1997 | Okajima et al. | 428/690 |
| 5,700,592 A | 12/1997 | Mueller et al. | 428/690 |
| 5,702,643 A | 12/1997 | Reddy et al. | 252/301.65 |
| 5,711,898 A | 1/1998 | Reddy et al. | 252/301.65 |
| 5,912,533 A | 6/1999 | Lee et al. | 313/503 |
| 5,976,613 A | 11/1999 | Janusauskas | 427/66 |
| 6,023,371 A | 2/2000 | Onitsuka et al. | 359/620 |
| 6,053,795 A * | 4/2000 | Whitney et al. | 446/219 |
| 6,198,220 B1 * | 3/2001 | Jones et al. | 313/512 |
| 6,203,391 B1 | 3/2001 | Murasko | 445/24 |
| 6,218,774 B1 | 4/2001 | Pope | 313/461 |
| 6,258,954 B1 * | 7/2001 | Kunimoto et al. | 546/36 |
| 6,392,786 B1 * | 5/2002 | Albert | 359/296 |
| 6,406,803 B1 | 6/2002 | Abe et al. | 428/690 |
| 6,424,088 B1 | 7/2002 | Murasko | 313/506 |
| 6,489,045 B1 | 12/2002 | Araki et al. | 428/690 |
| 6,498,049 B1 | 12/2002 | Friend et al. | 438/34 |
| 6,559,449 B1 | 5/2003 | Ikeda et al. | 250/361 |
| 6,562,460 B1 * | 5/2003 | Bayless | 428/402.24 |
| 6,610,223 B1 | 8/2003 | Lee | 264/9 |
| 6,611,109 B1 | 8/2003 | Zovko et al. | 315/169.3 |
| 6,613,455 B1 | 9/2003 | Matsumoto et al. | 428/690 |
| 6,706,551 B1 | 3/2004 | Andriessen | 438/99 |
| 6,777,724 B1 | 8/2004 | Duggal et al. | 257/184 |
| 6,903,505 B1 | 6/2005 | McNulty et al. | 313/504 |
| 2001/0030325 A1 | 10/2001 | Epstein et al. | |
| 2001/0035716 A1 | 11/2001 | Murasko | |
| 2001/0042329 A1 | 11/2001 | Murasko et al. | |
| 2002/0011786 A1 | 1/2002 | Murasko et al. | |
| 2002/0155214 A1 | 10/2002 | Murasko et al. | |
| 2002/0157173 A1 | 10/2002 | Murasko et al. | |
| 2002/0159245 A1 | 10/2002 | Murasko et al. | |
| 2002/0159246 A1 | 10/2002 | Murasko et al. | |
| 2003/0015962 A1 | 1/2003 | Murasko et al. | |
| 2003/0032361 A1 | 2/2003 | Murasko et al. | |
| 2003/0099884 A1 * | 5/2003 | Chiang et al. | 429/233 |
| 2003/0140768 A1 * | 7/2003 | Barnardo | 84/477 R |
| 2004/0217929 A1 * | 11/2004 | Albert et al. | 345/84 |

FOREIGN PATENT DOCUMENTS

| | | |
|---|---|---|
| WO | WO 98/53645 | 11/1998 |

OTHER PUBLICATIONS

Article published in Nano Letters, vol. 1, No. 8, 2001, pp. 429-433 by J. F. Suyver et al. entitled Synthesis and Photoluminescence of Nanocrystalline $ZnS:Mn^2$.

Article by David Lieberman published online by EETimes at http://www.eetimes.com/story/OEG20000919S0014, Nov. 14, 2002. (4 pg).

Article published in Chem. Rev., 102, 2002, pp. 2357-2368, by Junji Kido et al. entitled Organo Lanthanide Metal Complexes for Electroluminescent Materials.

Article in the Handbook of Conducting Polymers by T.A. Skotheim et al. Eds., Marcel Dekker, Inc., New York, 1998, pp. 823-845, by R. H. Friend et al. entitled Electroluminescence in Conjugated Polymers.

Article published in the Journal of Molecular Electronics, vol. 4, 1998, pp. 37-46, by R.H. Friend entitled Optical Investigations of Conjugated Polymers.

Article published in the Japanese Journal of Applied Physics, vol. 21, No. 6 Jun. 1982, pp. 860-864, by Kenzo Kojima et al. entitled Electroluminescence in Polyethylene Terephthalate (PET) I. Impulse Voltage.

Article published in J. Chem. Soc., Chem. Commun., 1983, pp. 954-955, by Denis G. H. Ballard et al. entitled A Biotech Route to Polyphenylene.

Article published in Polymer, vol. 30, Jun. 1989, (Conference issue) by John D. Stenger-Smith et al. entitled Spectroscopic and cyclic voltammetric studies of poly (p-phenylene vinylene) prepared from two different sulphonium salt precursor polymers, pp. 1048-1052.

Article published in J. Phys. D (Applied Physics), vol. 20, 1987, pp. 1389-1410, by D. D. O. Bradley entitled Precursor-route poly (p-phenylenevinylene): polymer characterization and control of electronic properties.

Article published in Synthetic Metals (28), 1989, pp. C687-C690, by H. Tomozawa et al. entitled Metal-Polymer Schottky Barriers on Processible Polymers.

Article in Luminescence of Solids; edited by D. R. Vij, Plenum Press, New York, 1998, pp. 221-269 by H. E. Gumlich et al. entitled Electroluminescence.

Article in Advanced Materials, 14, No. 16, Aug. 16, 2002, pp. 1147-1150, by G. A. Hebbink et al. entitled Lanthanide (III)-Doped Nanoparticles That Emit in the Near-Infrared.

"Zinc Sulfide" online at http://ncsr.csci-va.com/materials/zns.asp, Oct. 28, 2002. (423).

Proceedings of the $2_{nd}$International Symposium on Advanced Luminescent Materials and Quantum Confinement, $201_{st}$Meeting of the Electrochemical Society, 185, 2002, by J. F. Suyver et al. entitled (Electro) Luminescence of Solutions, Powders and Layers of ZnSe:Cu Nanocrystals.

I-components website, Technology, at http://www.i-components.co.kr/korean/technology.htm, Nov. 14, 2002, (14 pages).

Orgacon Conductive Transparent Films, Application Sheet, entitled Patterning Orgacon Film by Means of UV Lithography, AGFA, revised May, 2001, (3 pages).

http://www.kressworks.com/Research/Qu . . . /Electroluminescence Of Organic Polymer.ht, Jul. 3, 2002, (12 pages).

International Search Report dated Jan.17, 2003 for International Application No. PCT/US02/13547.

* cited by examiner

ELECTROLUMINESCENT DEVICES FABRICATED WITH ENCAPSULATED LIGHT EMITTING POLYMER PARTICLES

RELATED APPLICATION

This application is a nonprovisional to U.S. application Ser. No. 60/287,321, filed Apr. 30, 2001, entitled "ELECTROLUMINSCENT DEVICE FABRICATED WITH ENCAPSULATED LIGHT EMITTING POLYMER PARTICLES" and U.S. application Ser. No. 60/287,612, filed Apr. 30, 2001, entitled "ELECTROLUMINSCENT DEVICE FABRICATED WITH ENCAPSULATED LIGHT EMITTING POLYMER PARTICLES", which are incorporated herein by reference.

BACKGROUND OF THE INVENTION

Technical Field

The present system relates generally to electroluminescent devices including electroluminescent panels, and more specifically, to electroluminescent devices fabricated from materials including light emitting polymers and particles comprising light emitting polymers that have been encapsulated with conductive polymers and/or insulative polymers.

Problem:

The short lifetime of organic light emitting polymers (LEPs) is presently a major impediment to their use in commercial environments. Organic LEPs are unstable when exposed to air and humidity. In addition to oxygen, other contaminants present in air, such as ozone and $NH_3$, also adversely affect the useful lifetime of LEPs.

Heretofore, lamps fabricated from LEPs have been entirely encapsulated, or have had exposed surfaces coated with protective layers to achieve stability. This large-scale encapsulation/coating process is costly, and requires the use of relatively expensive transparent material.

In addition, the phosphors used in previous EL devices require relatively high voltage, typically in the range of about 60 to about 300 V AC. What is need is an electroluminescent device that requires minimal operating voltage and that exhibits long term stability in a environment containing various contaminants, such as outdoors or in industrial facilities.

Solution

The present electroluminescent display device employs organic light emitting polymer (LEP) particles encapsulated with a conductive polymer or thin, insulative polymer to provide LEP stability. The encapsulated particles are formulated into an ink system that can be printed to form a light emitting device.

Devices fabricated from light emitting polymers provide a number of advantages over phosphor electroluminescent devices including higher possible luminosity and low voltage/low current requirements resulting in low power consumption. These electrical characteristics are compatible with low voltage batteries, and allow long life with 9 volt or 1.5 volt "AA" batteries. This low power requirement makes solar powered LEP devices feasible for remote and mobile applications.

In addition, the electroluminescent LEP display device of the present invention is highly resistant to thermal shock and cycling, making it particularly suitable for use outdoors where ambient temperatures often fluctuate by large amounts.

Furthermore, in contrast to existing electroluminescent panels, such characteristics are achieved by the present invention without encapsulating the panel in an expensive material that in turn increases the cost of the panel and limits the freedom of design. The encapsulation of the LEP particles that are used to provide electroluminescence of the present invention provide protection from environmental contaminants, thus prolonging the life span of the panels.

Because of the inherent ability of the present device to function advantageously in weather extremes and also to operate for long periods of time on low voltage batteries, displays fabricated in accordance with the present invention are particularly suited to applications such as bicycle or motorcycle helmets as well as being affixed to various types of vehicles to improve their visibility and the safety of the rider or occupants. Such an illumination system also provides a mechanism for conveying an easily visible message in the form of a design logo or written information, which can be easily used on helmets and vehicles to promote brand awareness.

Panels fabricated in accordance with the present invention may be used in practically any application, indoors or outdoors, where incandescent, fluorescent, or halogen lighting is presently used.

DETAILED DESCRIPTION

U.S. patent application Ser. No. 09/815,078, filed Mar. 22, 2001, now abandoned for an "Electroluminescent Multiple Segment Display Device", discloses a system for fabricating an electroluminescent display device from materials including light emitting polymers (LEPs), the disclosure of which is herein incorporated by reference. The present electroluminescent device may include functional layers which comprise compounds that are organic or inorganic, or combinations thereof. Such a device is termed an organic/inorganic hybrid. The present electroluminescent device further includes an illumination layer comprising light emitting polymers (LEP) or LEP particles which have been encapsulated with a conductive polymer or thin, transparent or semi-transparent insulative polymer (e.g., polyvinylbutyral, Teflon, or polyethylene, etc.).

Figure 1A:
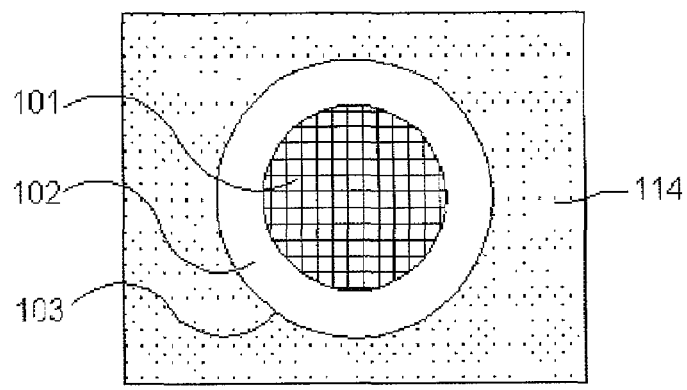
FIG. 1A is a diagram of a light emitting polymer particle encapsulated in accordance with one embodiment of present invention.
Figure 1B:
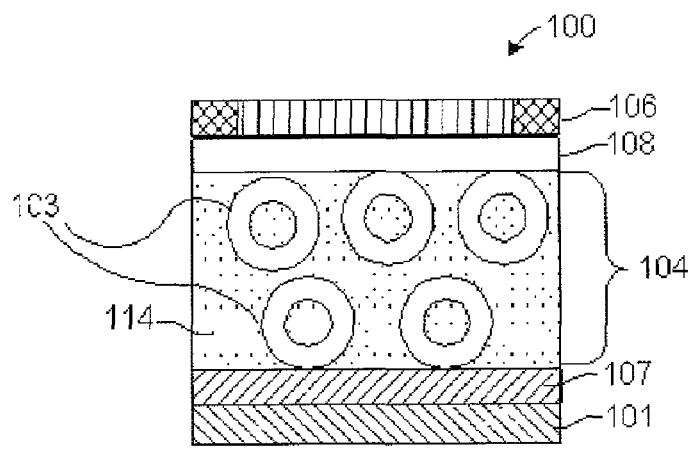
FIG. 1B is a diagram of a light emitting polymer electroluminescent device in accordance with one embodiment of present invention.

FIG. 1A is a diagram of a light emitting polymer particle encapsulated in accordance with one embodiment of present invention, and FIG. 1B is a diagram of a light emitting polymer electroluminescent device 100, in accordance with the same embodiment. As shown in FIGS. 1A and 1B, LEP particles 101 are coated with a conductive polymer (e.g., an inherently conductive polymer or ICP) 102 to form an encapsulated particle 103, which is suspended in an polymeric ink binder 114, to form illumination layer 104, as indicated by the dotted shading. Illumination layer 104 is sandwiched between an electron transporting layer 107 (e.g., Ag, Mg, Al, Cu, etc.) and a hole transporting layer 108 which may be organic or inorganic or a combination (e.g., PDOT, PANI, ITO, Ppy, etc.). Electron transporting layer 107 is situated on one surface of substrate 101. A front outlining electrode lead (FOEL) 106 is situated on hole transporting electrode 108. Power connection leads (Ag or C) are attached to electron transporting layer 107 and to hole transporting layer 108 to complete fabrication of LEP device 100.

In operation, an AC electrical potential having a frequency of between approximately 50 Hz and 1 Khz is applied across electron transporting layer 107 and hole transporting layer 108 to cause illumination of device 100.

LEP Particle Encapsulation Process

Figure 2:
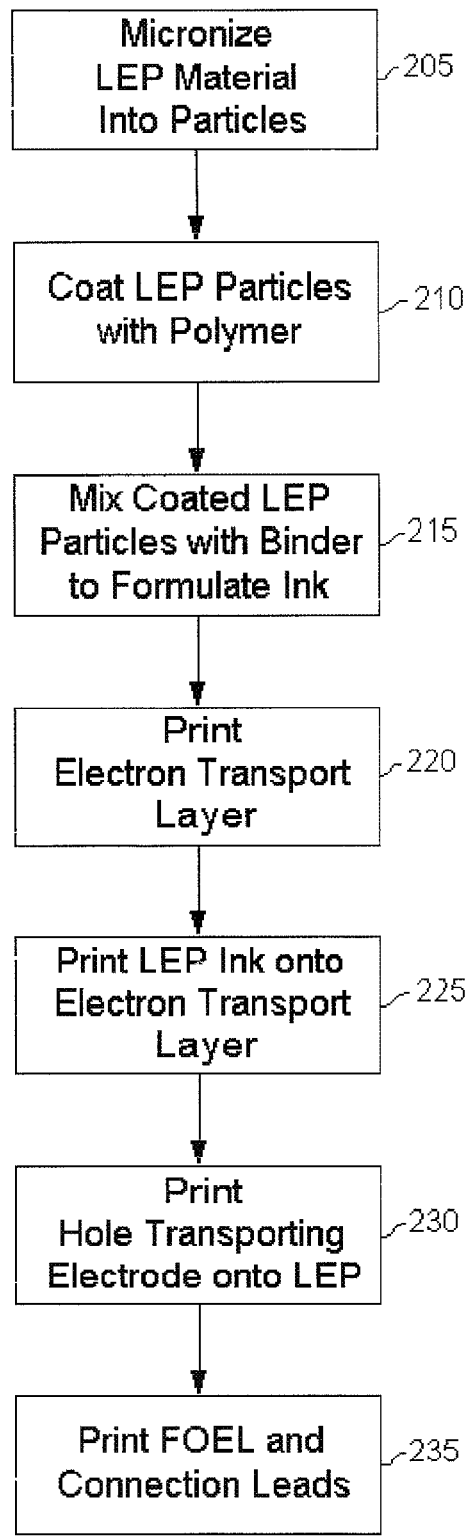
FIG. 2 is a flowchart illustrating an exemplary method for fabricating an electroluminescent device in accordance with the embodiment of FIG. 1B.

FIG. 2 is a flowchart illustrating an exemplary method for fabricating an electroluminescent device in accordance with the embodiment of FIG. 1B. As shown in FIG. 2:

Step 205: LEP particles 101 are prepared by micronizing using an air mill or grinding them to an ultimate particle size of approximately 50 microns or less. Note also that small particles are also obtainable directly in the synthetic process for preparation of the polymer. LEPs such as polypyridine, poly(p-phenylene vinylene) or poly[2-methoxy-5-(2'-ethylhexyloxy)-1,4-phenylenevinylene] may be used. Additional LEPs include poly[2-methoxy-5-(2-ethylhexyloxy)-1,4-phenylene-vinylene] ;poly[(2-methoxy-5-(2-ethylhexyloxy)-1,4-phenylene-vinylene)-alt-co-(4,4'-biphenylene-vinylene)]; poly[(9,9-dioctyl-2,7-divinylenefluorenylene)-alt-co(9,10-anthracene)]; poly[(9,9-dioctyl-2,7-divinylenefluorenylene)-alt-co-(4,4'-biphenylene)]; poly[{9, 9-dioctyl-2,7-divinylene-fluorenylene}-alt-co-{2-methoxy-5-(2-ethyl-hexyloxy)-1,4-phenylene}]; poly[{9,9-dioctyl-2, 7-bis(2-cyanovinylene-fluorenylene}-alt-co-{2-methoxy-5-(2-ethyl hexyloxy)-1,4-phenylene}]; poly[2-methoxy-5-(2-ethylhexyloxy)-1,4-(1-cyanovinylenephenylene)]; poly[{9, 9-dihexyl2,7-bis(1-cyanovinylene)fluorenylene}-alt-co-{2, 5-bis(N, N'-diphenylamino)-1,4-phenylene}]; poly[{9-ethyl-3,6-bis(2-cyanovinylene)carbazolylene)}-alt-co-{2-methoxy-5-(2-ethylhexyloxy)-1,4-phenylene}]; poly[(9,9-di(2-ethylhexyl)-fluorenyl-2,7-diyl)-co-(N, N'-diphenyl)-N, N'-di-(p-butyl phenyl)-1,4-diaminobenzene]; poly[2-(6-cyano-6-methylheptyloxy)-1,4-phenylene); poly[{9,9-dioctylfluorenyl-2,7-diyl}-co-{1,4-(2,5-dimethoxy)benzen poly[{9,9-dioctylfluorenyl-2,7-diyl}-co {1,4-(2,5-dimethoxy)benzene}]; poly[(9,9-dioctylfluorenyl-2,7-diyl)-co-(1,4-ethylenylbenzene)]; poly[(9,9-dioctylfluorenyl-2,7-diyl)-co-(1,4-diphenylene-vinylene-2-methoxy-5-{2-ethylhexyloxy}-benzene)]; poly[(9,9-dihexylfluorenyl-2,7-divinylenefluorenylene)]; poly[(9,9-dihexyl-2,7-(2-cyanodivinylene)fluorenylene)]; poly[(9,9-dioctylfluorenyl-2,7-diyl)-co-(1,4-vinylenephenylene)]; poly[(9,9-dioctylfluorenyl-2,7-diyl)-co-(1,4-vinylenephenylene)]; poly(9,9-dioctylfluorenyl-2,7-diyl; poly(9,9-dihexylfluorenyl-2,7-diyl); poly[9,9-di-(2-ethylhexyl)-fluorenyl-2,7-diyl]; poly[(9,9-dioctylfluorenyl-2,7-diyl)-co-(N,N'-diphenyl)-N,N'-di(p-butyloxyphenyl)-1,4-diaminobenzene)]; poly[(9,9-dioctylfluorenyl-2,7-diyl)-alt-co-(N,N'-diphenyl)-N,N'-di(p-butyloxy-phenyl) 1,4-diaminobenzene)]; poly[(9, 9-dihexylfluorenyl-2,7-diyl)-co-(1,4-benzo-{2,1',3}-thiadiazole)]; poly[(9,9-dihexylfluorenyl-2,7-diyl)-alt-co-(9,10-anthracene)]; poly[(9,9-dioctylfluorenyl-2,7-diyl)-alt-co-(N, N'-bis{4-butylphenyl}-benzidine-N,N'-{1,4-diphenylene})]; poly[(9,9-dihexylfluorenyl-2,7-diyl)-alt-co-(2-methoxy-5-{2-ethylhexyloxy}-1,4-phenylene)]; poly[(9, 9-dihexylfluorenyl-2,7-diyl)-co-(9,ethyl-3,6-carbazole)]; poly[(9,9-dihexylfluorenyl-2,7-diyl)-alt-co-(9,ethyl-3,6-carbazole)]; poly[(9,9-dihexylfluorenyl-2,7-diyl)-alt-co-(9,9'-spirobifluorene-2,7-diyl]; poly[(9,9-dihexylfluorenyl-2,7-diyl)-co-(2,5-p-xylene)]; poly[(9,9-dihezylfluorinl-2,7-diyl)-co-(3,5-pyridine)];poly[(9,9-dihexhglfluorenyl-2,7-diyl)-poly[ (9,9-dihexylfluorenyl-2,7-diyl)-alt-co-(9,9-di-{5-pentanyl}-fluorenyl-2',7'-diyl; poly[(9,9-dihexylfluorenyl-2,7-diyl)-co-(6,6'{2,2'-bipyridine})]; poly[(9,9-dihexylfluorenyl-2,7-diyl)-co-(6,6'-{2,2': 6',2"-terpyridine})]; and poly[(9,9-dihexylfluorenyl-2,7-diyl)-co-(N,N'bis{p-butylphenyl}-1,4-diamino phenylene)], all of which are commercially available from American Dye Source, Inc.

In an alternative, LEP particles may comprise OLEDs (organic light emitting devices), which includes organic and inorganic complexes, such as tris(8-hydroxyquinolato) aluminum; tetra(2-methyl-8-hydroxyquinolato) boron; lithium salt; 4,4'-bis(9-ethyl-3-carbazovinylene)-1,1'-biphenyl; 9,10-di[(9-ethyl-3-carbazoyl)-vinylenyl)]-anthracene; 4,4'-bis(diphenylvinylenyl)-biphenyl; 1,4-bis(9-ethyl-3-carbazovinylene)-2-methoxy-5-(2-ethylhexyloxy)benzene; tris (benzoylacetone)monophenanthroline) europium (III); tris (dibenzoylmethane)mono(phenanthroline) europium (III); tris(dibenzoylmethane)mono(5-aminophenanthroline)europium (III); tris(dinapthoylmethane)monophenanthroline) europium (III); tris(diphenoylmethane)mono( phenanthroline) europium (III); tris(dibenzoylmethane)mono(4,7-diphenyl phenanthroline)europium (III); tris(dibenzoylmethane)mono(4,7-dimethyl-phenanthroline)europium (III); tris(dibenzoylmethane)mono(4,7-dihydroxy-phenanthroline)europium (Ill); tris(dibenzoylmethane)mono(4,7-dihydroxyloxy-phenanthroline)europium (III); lithium tetra (2-methyl-8-hydroxyquinolinato) boron; lithium tetra(8-hydroxyquinolinato) boron; 4,4'-bis(9-ethyl-3-carbazovinylene)-1,1'-biphenyl; bis(8-hydroxyquinolinato) zinc; bis(2-methyl-8-hydroxyquinolinato)zinc; Iridium (III) tris(2-phenylpyridine); tris(8-hydroxyquinoline)aluminum; and tris[1-phenyl-3-methyl-4-(2,2-dimethylpropan-1-oyl)-pyrazolin-5-one]-terbium, many of which are commercially available from American Dye Source, Inc.

Light emitting polymers and OLEDs operate off low voltage and are more readily adaptable to being applied in thin layers than phosphors containing zinc sulfide, which exhibit graininess when applied as a thin coating.

Step 210: LEP particles 101 are then coated with a conductive polymer 102 or, alternatively, a thin, insulative polymer using a fluidized bed coater. In this process, the particles are fluidized in an air or nitrogen stream and material 102 spray coated onto the particles to form encapsulated particles 103.

Step 215: A Printing ink 104 is then formulated by mixing the LEP particles and binder polymers (e.g. poly(methylmethacrylate) or poly(butylmethacrylate) in a suitable solvent. Other suitable binder polymers may be any suitable thermoplastic, including poly(vinylbutyral), poly(vinylalcohol), poly (vinylchloride), polycarbonate, polystyrene, poly (vinylidene chloride), poly(vinylidene fluoride), poly(acrylonitrile), poly(oxyethylene), cellulose esters, cellulose ethers, nylon 6,6, nylon 12, nylon 6,12, poly(ethylene oxide), poly(ethylene-co-vinylacetate), poly(vinylcarbazole), poly(caprolactone), polysulfone, poly(vinylpyrrolidone), poly(4-vinylphenol), poly(methyloctadecylsiloxane), and the like. Other binder systems that may be employed include systems employing thermosetting resins, for example, systems with urethane and epoxies, as well as UV-curable binder systems.

Functional Stack Printing Process

In an exemplary embodiment, a functional electroluminescent device 100 is fabricated as a plurality of layers, called a 'stack', in accordance with the following steps:

Step 220: Print rear electrode (REL) (electron transport layer) 107 onto a suitable substrate in a desired pattern.

Step 225: Print LEP ink layer 104 onto the rear electrode patterns 107.

Step 230: Print transparent hole transporting electrode 108 onto LEP layer 104.

Step 235. Print front outlining electrode lead (FOEL) 106 onto hole transporting electrode 108. Print appropriate connection leads (Ag, C, or any suitable conductor) to rear electrode 107 and FOEL 106.

In the present embodiment, the rear electrode (electron transport layer) and transparent electrode (hole transport layer) are fabricated using conductive polymers to provide a totally polymeric system without metals or metallic compounds. It should be noted that although, in the embodiment described above, each of the layers is applied in steps 220 through 235 is applied by a printing process, any of these layers may be applied by any suitable method for depositing the layer material onto the corresponding stack element.

Figure 3:
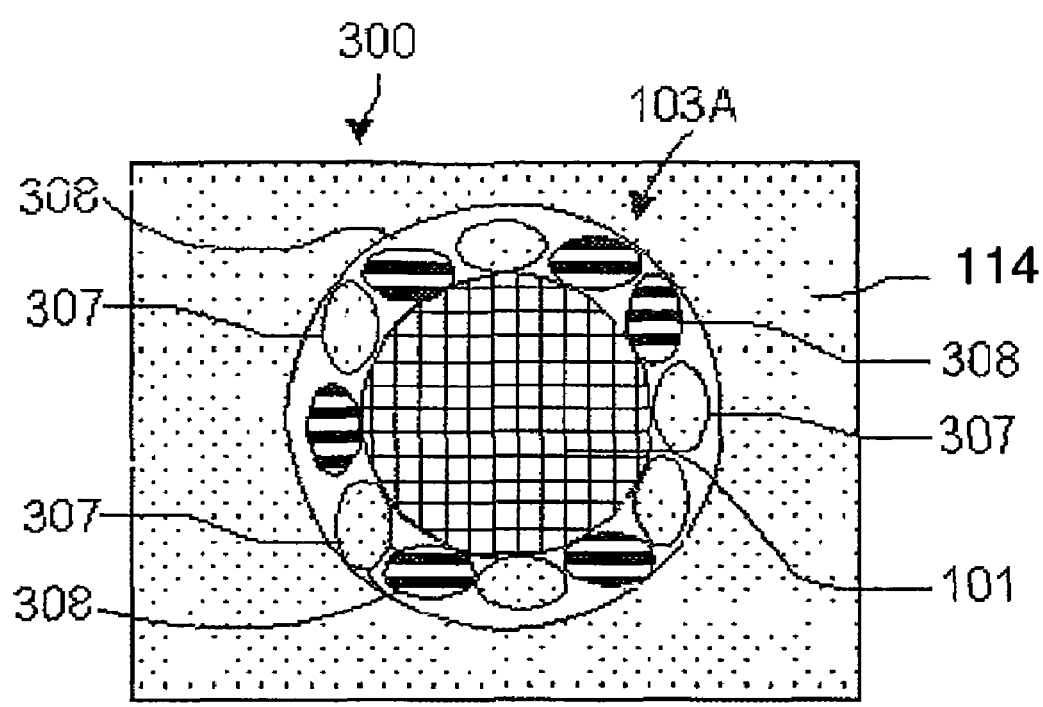
FIG. 3 illustrates an exemplary method for fabricating an LEP ink matrix illumination layer used in the present electroluminescent device.

FIG. 3 shows an LEP ink matrix 300 formed by partially coating LEP particles 101 (only one particle is shown) with both hole transporting and electron transporting materials. One method of forming such a coating is to use a fluidized bed (as described above) with a first application of hole transporting material, which may be organic or inorganic or a combination (e.g., PDOT, PANI, ITO, Ppy, etc.) followed by an application of electron transporting material (e.g., Ag, Mg, Al, Cu, etc.) to particles 101. In this embodiment, islands 308 of hole transporting material and islands 307 of electron transporting materials contact the LEP particles 101 to form coated particle 103A. When an electrical field is applied, both electrons and holes are simultaneously injected into the LEP particles. These electrons and holes then recombine and emit light. LEP ink matrix 300 may be used as layer 104 in device 100.

Figure 4:
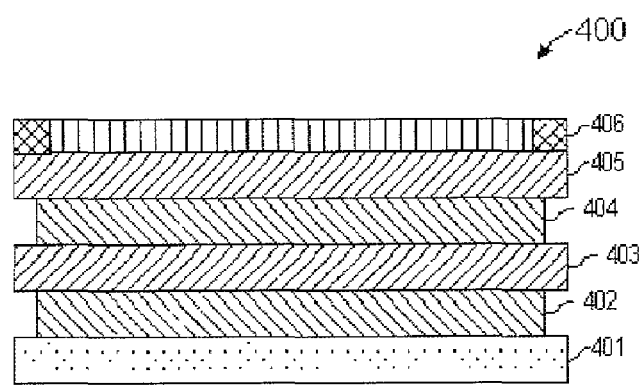
FIG. 4 is a block diagram of a light emitting polymer electroluminescent device in accordance with an alternative embodiment of present invention.

FIG. 4 is a schematic illustration of an alternative embodiment of an electroluminescent (EL) multi-segment display device 400 comprising a substrate 401, a rear electrode layer 402, a dielectric layer 403, an illumination layer 404, an electrically conductive layer 405, and a front outlining electrode lead ('front electrode') 406. Substrate 401 may comprise either metal or an electrically non-conducting material. If, for example, an aluminum substrate is used, then it is first coated with an insulative material.

Rear electrode 402 is formed of an electrically conductive material, e.g., silver or carbon particles. Dielectric layer 403 is formed of high dielectric constant material, such as barium titanate. Illumination layer 404 is formed of LEP particles, as described above. Front electrode 406 may be formed of silver particles or other electrically conductive material.

Figure 5:
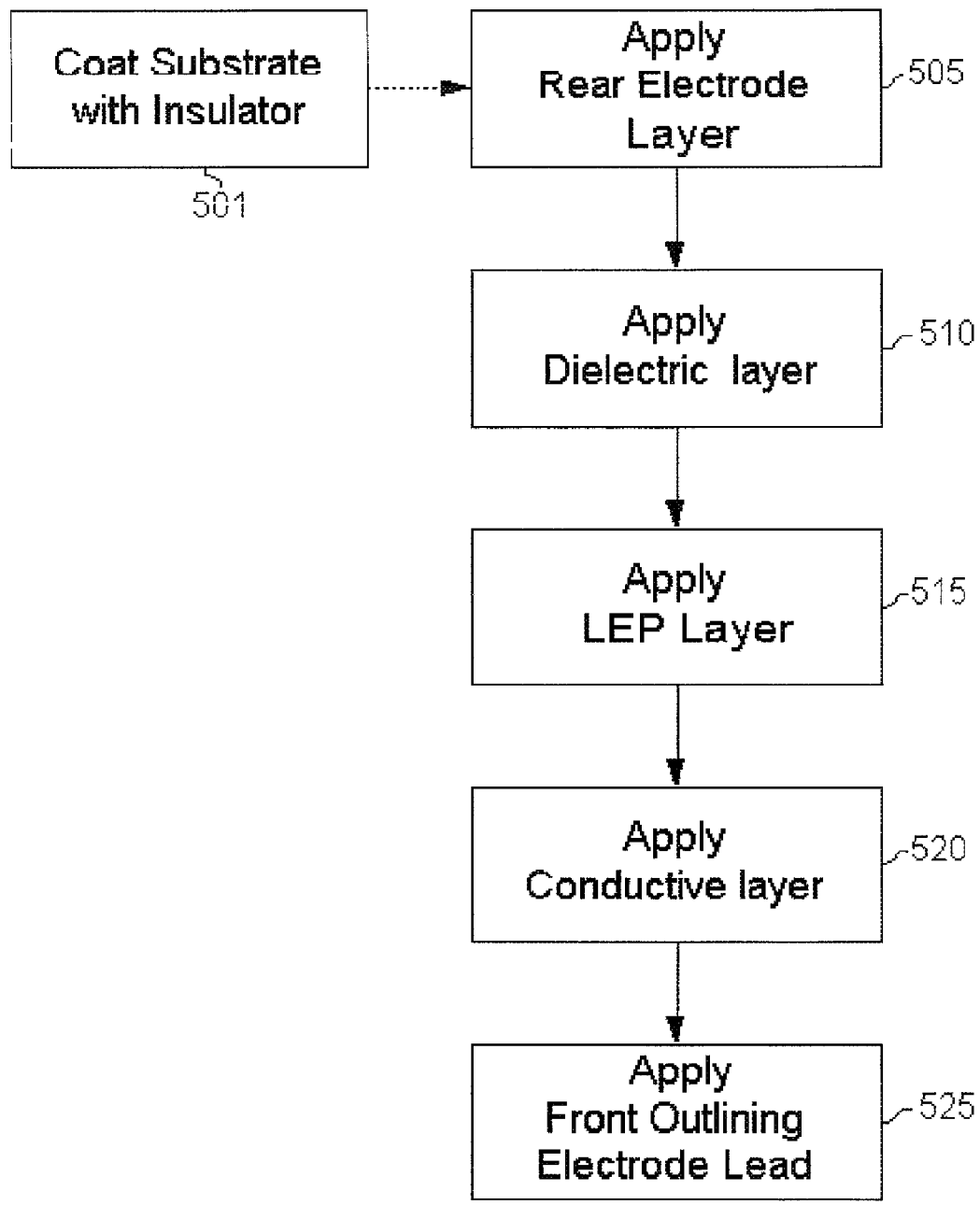
FIG. 5 is a flowchart illustrating an exemplary method for fabricating an electroluminescent device in accordance with the embodiment of FIG. 4.

FIG. 5 is a flow chart showing an exemplary sequence of steps for fabricating the electroluminescent display device shown in FIG. 1. Fabrication of the present device 100 is best understood by viewing FIGS. 4 and 5 in conjunction with one another. If substrate 401 is a metal or other conductor, such as aluminum, then at step 501, an insulative coating is first applied over the substrate using a compound such as Nazdar's Plastic Plus (Nazdar Mid-America, St. Louis, Mo.). If substrate 401 is formed from a non-conductor, such as a polyester film, polycarbonate, or other plastic material, no coating is required.

At step 505, rear electrode 402 is applied over a front surface of substrate 401. In an exemplary embodiment, rear electrode 402 is formed of conductive particles, e.g., silver or carbon, dispersed in a polymeric or other binder to form a screen printable ink. In one embodiment, rear electrode 402 may comprise a silver particle ink such as DuPont 7145. Alternatively, rear electrode 402 may comprise a conductive organic polymer such as polyaniline, polypyrrole, and poly (3,4-ethylenedioxythiophene). In an exemplary embodiment, a carbon rear electrode 402 may have a thickness of between approximately $2 \times 10^{-4}$ inches and $6 \times 10^{-4}$ inches. It is to be noted that rear electrode layer 402, as well as each of the layers 403–406 that are successively applied in fabricating device 100, may be applied by any appropriate method, including an ink jet process, a stencil, flat coating, brushing, rolling, spraying, etc.

Rear electrode layer 402 may cover the entire substrate 401, but this layer 402 typically covers only the illumination area (the area covered by LEP layer 404, described below).

At step 510, optional dielectric layer 403 is applied over rear electrode layer 402. In an exemplary embodiment, dielectric layer 403 comprises a high dielectric constant inorganic material, such as barium titanate dispersed in a polymeric binder to form a screen printable ink. In one embodiment, the dielectric may be an ink such as DuPont 7153. Dielectric layer 403 may cover substrate 401 either entirely, or may alternatively cover only the illumination area. Alternatively, dielectric layer 403 may include a high dielectric constant inorganic material such as alumina oxide dispersed in a polymeric binder. The alumina oxide layer is applied over rear electrode 402 and cured by exposure to UV light. In an exemplary embodiment, dielectric layer 403 may have a thickness of between approximately $6 \times 10^{-4}$ inches and $1.5 \times 10^{-3}$ inches.

In accordance with one embodiment, dielectric layer 403 has substantially the same shape as the illumination area, but extends approximately 1/16" to 1/8" beyond the illumination area. Alternatively, dielectric layer 403 may cover substantially all of substrate 401.

At step 515, illumination layer 404 is applied over dielectric layer 403. Illumination layer 404 is formulation in accordance with the process described above with respect to FIGS. 1A, 1B, and 2. The size of the illumination area covered by LEP layer 404 may range from approximately 1 sq. inch to 100 sq. inches. In an exemplary embodiment of the present system, illumination layer 404/104 comprises light emitting polymers, and has a thickness of between approximately $8 \times 10^{-4}$ and $1.2 \times 10^{-3}$ inches.

At step 520, conductive layer 405 is printed over LEP layer 404, extending about 1/16" to 1/8" beyond LEP area 404. The distance beyond the Illumination layer to which conductive layer 405 extends is a function of the size of the device. Accordingly, the extension of conductive layer 405 beyond Illumination area 404 may advantageously be between approximately 2 percent and 10 percent of the width of Illumination layer 404. In an exemplary embodiment, conductive layer 405 comprises an inorganic compound such as indium tin oxide (ITO) particles in the form of a screen printable ink such as DuPont 7160. In an alternative embodiment, conductive layer is non-metallic and is translucent or transparent, and comprises an organic conductive polymer, such as polyaniline, pyrrole, or poly(3,4-ethylenedioxythiophene). In an exemplary embodiment, an ITO conductive layer 405 may have a thickness of between approximately $2 \times 10^{-4}$ inches and $5 \times 10^{-4}$ inches.

At step 525, a front electrode, or more specifically, a front outlining electrode layer 406, comprising a conductive material such as silver or carbon, is applied onto the outer perimeter of conductive layer 405 to transport energy thereto. Front electrode 406 is typically 1/16" to 1/8" wide strip, approximately 2 percent to 20 percent of the width of conductive layer 405, depending on the current drawn by device 100 and the length of the device from the controller or power source. For example, front electrode 406 may be approximately 1/8" wide for a 50" wire run from the controller.

Front electrode leads may be screen printed onto substrate 401, or may be fabricated as interconnect tabs extending beyond the substrate to facilitate connection to a power source or controller. In one embodiment, front outlining electrode layer 406 contacts substantially the entire outer perimeter of conductive layer 405 and does not overlap rear electrode 402. In an alternative embodiment, front electrode 406 contacts only about 25% of the outer perimeter of conductive layer 405. The front electrode may be fabricated to contact any amount of the outer perimeter of conductive layer 405 from about 25% to about 100%. Front outlining electrode 406 may, for example, comprise silver particles that form a screen printable ink such as DuPont 7145. In an alternative embodiment, front outlining electrode 406 is non-metallic and is translucent or transparent, and comprises an organic conductive polymer, such as polyaniline, polypyrrole, or poly(3,4-ethylenedioxythiophene). Fabricating front and rear electrodes 406/402 with polymers such as the aforementioned compounds would make device 100 more flexible, as well as more durable and corrosion resistant. In an exemplary embodiment, a silver front outlining electrode layer 406 may have a thickness of between approximately $8 \times 10^{-4}$ and $1.1 \times 10^{-3}$ inches.

Figure 6:
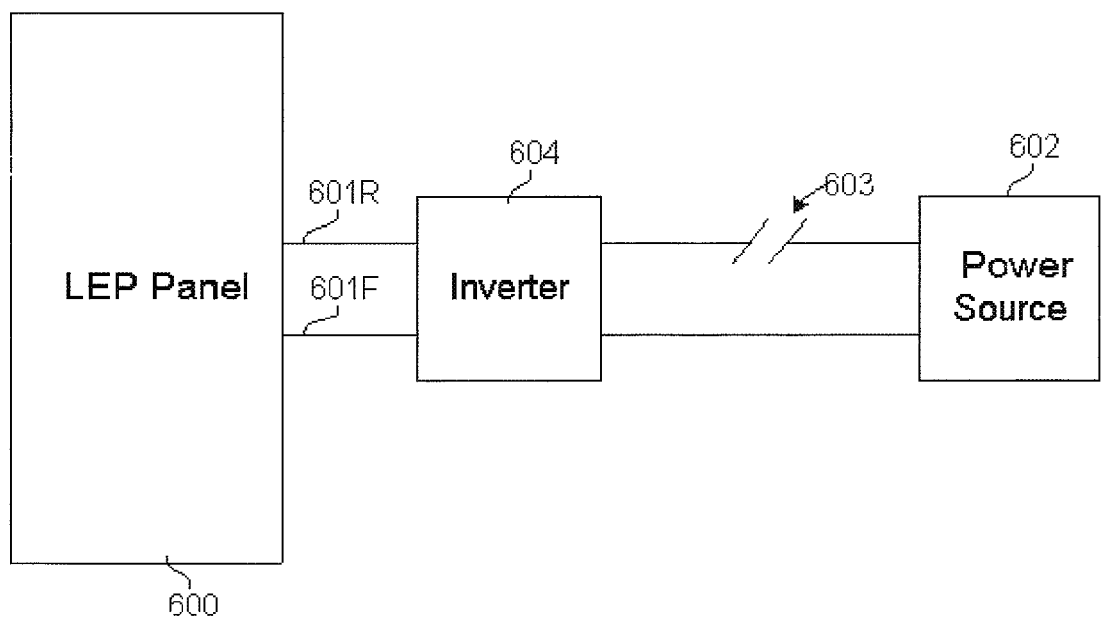
FIG. 6 illustrates an exemplary electroluminescent panel fabricated using light emitting polymers in accordance with the present method.

FIG. 6 provides a further illustration of a an exemplary electroluminescent LEP panel 600 fabricated using light emitting polymers in accordance with the presently disclosed embodiments. As shown in FIG. 6, panel 600 achieves electroluminescence by the application of an electrical current to rear and front electrode layers 107 and 106. For EL panels that require AC power, DC power source 602 is connected to an inverter 604 with the output of inverter 604 being directed to leads 601R and 601F, connected to rear electrode layer 107 and front electrode layer 106, respectively. Control switch 603 is placed between power source 602 and inverter 604 in order to allow the user of panel 600 to selectively turn the electroluminescent function to ON or OFF positions. If EL panel 600 operates with DC power, inverter 604 is not required, and leads 601R and 601F are connected directly to switch 606. Control switch 603 may be a two-position ON/OFF switch, a dimmer switch, a slide switch, a switch capable of causing on and off flashing, a remote control switch, or any other control switch that may cause a desired effect. Control switch 603 may also be a manually operated switch or an automatic switch that has been preprogrammed to activate and deactivate panel 600 in response to certain conditions, such as the onset of darkness.

What is claimed is:

1. A method for fabricating an electroluminescent display device comprising:
   encapsulating particles of a light emitting polymer with a conductive polymer to form encapsulated light emitting polymer particles having a conformal coating of a conductive polymer;
   formulating a printing ink by mixing the encapsulated light emitting polymer particles with a binder polymer;
   depositing a rear electrode onto a substrate in a pattern;
   depositing the printing ink onto the rear electrode to form an illumination layer;
   depositing a transparent hole transporting electrode onto the illumination layer;
   depositing a front outlining electrode onto the hole transporting electrode; and
   depositing connection leads to the rear electrode and the front outlining electrode.

2. The method according to claim 1, wherein said display device is an electroluminescent panel.

3. The method according to claim 1, wherein the light emitting polymer comprises at least one member that is selected from the group consisting of polypyridine, poly(p-phenylene vinylene), poly[2-methoxy-5-(2'-ethylhexyloxy)-1,4-phenylenevinylene], poly[2-methoxy-5-(2-ethylhexyloxy)-1,4-phenylenevinylene], poly[(2-methoxy-5-(2-ethylhexyloxy)-1,4-phenylenevinylene)-alt-co-(4,4'-biphenylene-vinylene)], poly[(9,9-dioctyl-2,7-divinylenefluorenylene)-alt-co-(9,10-anthracene)], poly[(9,9-dioctyl-2,7-divinylenefluorenylene)-alt-co-(4,4'-biphenylene)], poly[{9,9-dioctyl-2,7-divinylenefluorenylene}-alt-co-{2-methoxy-5-(2-ethyl-hexyloxy)-1,4-phenylene}], poly[{9,9-dioctyl-2,7-bis(2-cyanovinylenefluorenylene}-alt-co-{2-methoxy-5-(2-ethyl hexyloxy)-1,4-phenylene}], poly[2-methoxy-5-(2-ethylhexyloxy)-1,4-(1-cyanovinylenephenylene)], poly[{9,9-dihexyl-2,7-bis(1-cyanovinylene)fluorenylene}-alt-co-{2,5-bis(N,N'-diphenylamino)-1,4-phenylene}], poly[{9-ethyl-3,6-bis(2-cyanovinylene)carbazolylene)}-alt-co-{2-methoxy-5-(2-ethylhexyloxy)-1,4-phenylene}], poly[(9,9-di(2-ethylhexyl)-fluorenyl-2,7-diyl)-co-(N,N'-diphenyl)-N,N'-di-(p-butyl phenyl)-1,4-diaminobenzene], poly[2-(6-cyano-6-methylheptyloxy)-1,4-phenylene), poly[{9,9-dioctylfluorenyl-2,7-diyl}-co-{1,4-(2,5-dimethoxy) benzene}], poly[{9,9-dioctylfluorenyl-2,7-diyl}-co-{1,4-(2,5-dimethoxy)benzene}], poly[(9,9-dioctylfluorenyl-2,7-diyl)-co-(1,4-ethylenylbenzene)], poly[(9,9-dioctylfluorenyl-2,7-diyl)-co-(1,4-diphenylene-vinylene-2-methoxy-5-{2-ethylhexyloxy}-benzene)], poly[(9,9-dihexylfluorenyl-2,7-divinylenefluorenylene)], poly[(9,9-dihexyl-2,7-(2-cyanodivinylene)-fluorenylene)], poly[(9,9-dioctylfluorenyl-2,7-diyl)-co-(1,4-vinylenephenylene)], poly[(9,9-dioctylfluorenyl-2,7-diyl)-co-(1,4-vinylenephenylene)], poly(9,9-dioctylfluorenyl-2,7-diyl, poly(9,9-dihexylfluorenyl-2,7-diyl), poly[9,9-di-(2-ethylhexyl)-fluorenyl-2,7-diyl], poly[(9,9-diootylfluorenyl-2,7-diyl)-co-(N,N'-diphenyl)-N,N'-di(p-butyloxyphenyl)-1,4-diaminobenzene)], poly[(9,9-dioctylfluorenyl-2,7-diyl)-alt-co-(N,N'-diphenyl)-N,N'-di(p-butyloxy-phenyl) 1,4-diaminobenzene)], poly[(9,9-dihexylfluorenyl-2,7-diyl)-co-(1,4-benzo-{2,1 ',3}-thiadiazole)], poly[(9,9-dihexylfluorenyl-2,7-diyl)-alt-co-(9,10-anthracene)], poly[(9,9-dioctylfluorenyl-2,7-diyl)-alt-co-(N,N'-bis{4-butylphenyl}-benzidine-N,N'-{1,4-diphenylenel})], poly[(9,9-dihexylfluorenyl-2,7-diyl)-alt-co-(2-methoxy-5-{2-ethylhexyloxy}-1,4-phenylene)], poly[(9,9-dihexylfluorenyl-2,7-diyl)-co-(9,ethyl-3,6-carbazole)]; poly

[(9,9-dihexylfluorenyl-2,7-diyl)-alt-co-(9,ethyl-3,6-carbazole)], poly[(9,9-dihexylfluorenyl-2,7-diyl)-alt-co-(9,9'-spirobifluorene-2,7-diyl], poly[(9,9-dihexylfluorenyl-2,7-diyl)-co-(2,5-p-xylene)], poly[(9,9-dihexylfluorenyl-2,7-diyl)-co-(3,5-pyridine)], poly[(9,9-dihexylfluorenyl-2,7-diyl)-co-(1,4-phenylene)], poly[(9,9-dihexylfluorenyl-2,7-diyl)-alt-co-(9,9-di-{5-pentanyl}-fluorenyl-2',7'-diyl, poly[(9,9-dihexylfluorenyl-2,7-diyl)-co-(6,6'{2,2'-bipyridine})], poly[(9,9-dihexylfluorenyl-2,7-diyl)-co-(6,6' -{2,2': 6',2"-terpyridine})], poly[(9,9-dihexylfluorenyl-2,7-diyl)-co-(N,N'bis{p-butylphenyl}-1,4-diamino phenylene)}, and combinations thereof.

4. The method according to claim 1, wherein the encapsulated light emitting polymer particles further comprise at least one member that is selected from the group consisting of tris(8-hydroxyquinolato) aluminum, tetra(2-methyl-8-hydroxyquinolato) boron, 4,4'-bis(9-ethyl-3-carbazovinylene)-1,1'-biphenyl, 9,10-di[(9-ethyl-3-carbazoyl)-vinylenyl)]-anthracene, 4,4'-bis(diphenylvinylenyl)-biphenyl, 1,4-bis(9-ethyl-3-carbazovinylene)-2-methoxy-5-(2-ethylhexyloxy) benzene, tris(benzoylacetonato)mono(phenanthroline) europium (III), tris(dibenzoylmethane)mono(phenanthroline) europium (III), tris(dibenzoylmethane)mono(5-aminophenanthroline)europium (III), tris(dinapthoylmethane) mono(phenanthroline) europium (III), tris (biphenoylmethane)mono(phenanthroline) europium (III), tris(dibenzoylmethane)mono(4,7-diphenyl phenanthroline) europium (III), tris(dibenzoylmethane)mono(4,7-dimethylphenanthroline)europium (III), tris(dibenzoylmethane) mono(4,7-dihydroxy-phenanthroline)europium (III), tris (dibenzoylmethane)mono(4,7-dihydroxyloxy-phenanthroline)europium (III), lithium tetra(2-methyl-8-hydroxyquinolinato) boron, lithium tetra(8-hydroxyquinolinato) boron, 4,4'-bis(9-ethyl-3-carbazovinylene)-1,1'-biphenyl, bis(8-hydroxyquinolinato) zinc, bis(2-methyl-8-hydroxyquinolinato)zinc, iridium (III) tris(2-phenylpyridine), tris(8-hydroxyquinoline)aluminum, tris[1-phenyl-3-methyl-4-(2,2-dimethylpropan-1-oyl)-pyrazolin-5-one]-terbium, and combinations thereof.

5. The method according to claim 1, wherein the conductive polymer comprises at least one member that is selected from the group consisting of polyaniline, polypyrrole, poly(3,4-ethylenedioxythiophene), and mixtures thereof.

6. The method according to claim 1, wherein said binder polymer is selected from the group consisting of poly(methylmethacrylate), poly(butylmethacrylate), poly(vinylbutyral), poly(vinylalcohol), poly (vinylchloride), polycarbonate, polystyrene, poly(vinylidene chloride), poly(vinylidene fluoride), poly(acrylonitrile), poly(oxyethylene), cellulose esters, cellulose ethers, nylon 6,6, nylon 12, nylon 6,12, poly(ethylene oxide), poly(ethylene-co-vinylacetate) ,poly(vinylcarbazole), poly(caprolactone), polysulfone, poly(vinylpyrrolidone), poly(4-vinylphenol), poly(methyloctadecylsiloxane), and combinations thereof.

7. The method according to claim 1, wherein said rear electrode comprises an inorganic compound.

8. The method according to claim 7, wherein said inorganic compound comprises indium tin oxide.

9. The method according to claim 1, wherein said rear electrode comprises an organic compound.

10. The method according to claim 9, wherein said organic compound is a conductive polymer selected from the group consisting of polyaniline, polypyrrole, poly(3,4-ethylenedioxythiophene), and combinations thereof.

11. The method according to claim 1, wherein said rear electrode is a mixture of inorganic and organic compounds.

12. The method according to claim 11, wherein said compounds are selected from the group consisting of indium tin oxide, polyaniline, polypyrrole, poly(3,4-ethylenedioxythiophene), and combinations thereof.

13. The method according to claim 1, wherein said hole transporting electrode comprises a material that is selected from the group consisting of poly(3,4-ethylenedioxythiophene), polyaniline, indium tin oxide, polypyrrole, and combinations thereof.

14. The method according to claim 1, wherein said front outlining electrode comprises a material that is selected from the group consisting of silver and carbon.

15. The method according to claim 1, wherein said electroluminescent display device comprises an organic/inorganic hybrid.

16. The method according to claim 1, wherein any of the depositing steps are performed by a printing process.

17. A method for fabricating an electroluminescent display device comprising:
   providing particles of a light emitting polymer having a coating comprising a hole transporting material and an electron transporting material wherein both the hole transporting material and the electron transporting material contact the particle of the light emitting polymer;
   formulating a printing ink by mixing the coated light emitting polymer particles with a binder polymer;
   depositing a rear electrode onto a substrate in a pattern;
   depositing the printing ink onto the rear electrode to form an illumination layer;
   depositing a transparent hole transporting electrode onto the illumination layer;
   depositing a front outlining electrode onto the hole transporting electrode; and
   depositing connection leads to the rear electrode and the front outlining electrode.

18. The method according to claim 17, wherein the hole-transporting material is selected from the group consisting of polyaniline, polypyrrole, poly(3,4-ethylenedioxythiophene), poly(phenylenevinylene), indium tin oxide, and combinations thereof; and the electron-transporting material is selected from the group consisting of silver, magnesium, aluminum, copper, and combinations thereof.

* * * * *

UNITED STATES PATENT AND TRADEMARK OFFICE
CERTIFICATE OF CORRECTION

PATENT NO. : 7,001,639 B2 Page 1 of 1
APPLICATION NO. : 10/135599
DATED : February 21, 2006
INVENTOR(S) : Matthew M. Murasko, Patrick J. Kinlen and Brent St. John It is certified that error appears in the above-identified patent and that said Letters Patent is hereby corrected as shown below:

Column 1,
Line 43, replace "need" with -- needed --.
Line 45, replace "a" with -- an --.

Column 3,
Line 27, replace ")benzen" with -- )benzene --.

Column 4,
Line 16, replace "-dihezytfluorine-" with -- -dihexylfluorenyl- --.
Line 17, replace "-dihexhglfluorenyl-" with -- -dihexylfluorenyl- --.
Line 18, insert -- co-(1,4-phenylene)]; -- between "diyl)-" and "poly[(9,9-dihexylfluorenyl-2,7-diyl)".
Line 34, replace "(benzoylacetone)" with -- (benzoylacetonato) --.

Column 8,
Line 56, replace "-diootylfluorenyl-" with -- dioctylfluorenyl- --.
Line 64, replace "-diphenylenel" with -- diphenylene --.

Signed and Sealed this

Twenty-seventh Day of June, 2006

JON W. DUDAS
*Director of the United States Patent and Trademark Office*